United States Patent [19]

Slay

[11] 4,101,903
[45] Jul. 18, 1978

[54] METHOD AND APPARATUS FOR MONITORING BCD CONTINUOUSLY VARYING DATA

[75] Inventor: Larry G. Slay, Dallas, Tex.

[73] Assignee: Rockwell International Corporation, El Segundo, Calif.

[21] Appl. No.: 710,512

[22] Filed: Aug. 2, 1976

[51] Int. Cl.² ............................................. G01D 5/14
[52] U.S. Cl. ............................. 346/33 R; 235/92 SH; 340/146.2; 364/607
[58] Field of Search ................ 346/33 R; 235/92 BD, 235/92 SH, 153 AP, 150.53, 150.5; 307/232; 328/119, 109, 110; 364/782, 602, 607; 340/146.2

[56] References Cited

U.S. PATENT DOCUMENTS

| | | | |
|---|---|---|---|
| 2,884,616 | 4/1959 | Fillebrown | 340/146.2 |
| 2,910,667 | 10/1959 | Lubkin | 340/146.2 |
| 2,976,104 | 3/1961 | Petersen | 346/33 R |
| 2,977,574 | 3/1961 | Pouliart | 340/146.2 |
| 3,218,609 | 11/1965 | Shaw | 340/146.2 |
| 3,484,586 | 12/1969 | Jernakoff | 235/150.5 X |
| 3,567,916 | 3/1971 | Fullton | 235/92 SH X |
| 3,573,443 | 4/1971 | Fein | 235/150.53 |
| 3,991,301 | 11/1976 | Chaprnka | 364/607 |

Primary Examiner—Joseph W. Hartary
Attorney, Agent, or Firm—Howard R. Greenberg; H. Fredrick Hamann

[57] ABSTRACT

Binary coded decimal continuously varying data is monitored by comparing the value of the least significant bit for each digit of each received digital word to the same bit value of the immediately preceding digital word and generating a pulse each time that that value changes and providing a composite pulse equal to the sum of the amplitudes of all coincident pulses to afford an easily readable visual display of the data.

12 Claims, 1 Drawing Figure

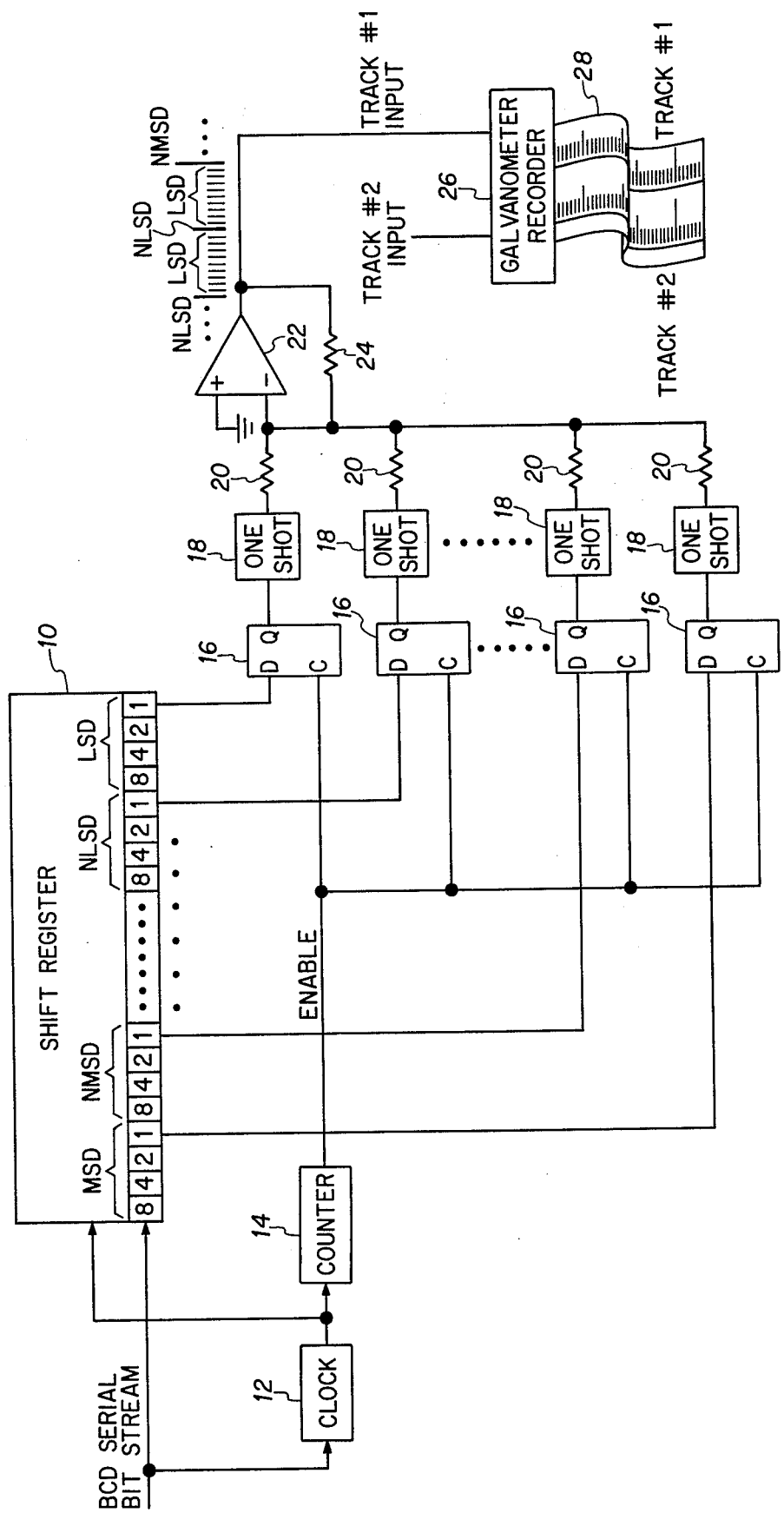

METHOD AND APPARATUS FOR MONITORING BCD CONTINUOUSLY VARYING DATA

BACKGROUND OF THE INVENTION

The subject invention pertains generally to digital electronics and specifically to a technique for facilely monitoring and displaying binary coded decimal digital words representative of continuously varying data.

Quite often it is desirable to present continuously varying data (no discontinuities) in a form which easily lends itself to comparison with other data. For example, in performing flight inspections to ascertain the accuracy and reliability of navigational ground station equipment, the equipment onboard the inspecting plane affords comparison of information received from the ground stations with information generated onboard the plane as a standard against which to determine errors in the received information. Although there appears to be no lack of such equipment for depicting information which is already in analog form, the same cannot be said for digitalized information, particularly that which is encoded in the form of binary coded decimal (bcd) digital words wherein each significant digit is represented by a four-bit digital signal.

With the foregoing in mind, it is a primary object of the present invention to provide a new and improved technique for monitoring binary coded decimal digital words representative of continuously varying data.

It is a further object of the present invention to provide such a new and improved technique which affords precise monitoring.

It is still a further object of the present invention to provide such a new and improved technique which lends itself to an easily readable visual display, in particular so that it can be facilely compared with other data.

The foregoing objects and the means by which they are achieved may best be appreciated by referring to the Detailed Description of the Preferred Embodiment which follows hereinafter together with the single appended drawing figure which pictorially depicts the invention.

BRIEF DESCRIPTION OF THE INVENTION

In accordance with the stated objects, the present invention monitors binary coded decimal digital words representative of continuously varying data by comparing the value of the least significant bit for each digit represented in each digital word to the same bit value of the immediately preceding digital word. Any time that a change in value is detected, denoting an incremental or decremental change in the digit value, a pulse is generated. To provide an easily readable visual display of the information, all pulses are applied to a summing means whose output provides a composite pulse whose amplitude is a function of the sum of all the amplitudes of coincident pulses, thereby providing an indication not only of the change in data but in particular which digit has changed. The rendition of the composite output pulses on a strip chart such as through a galvanometer recorder permits easy comparison of the data with another set of data applied to a second track thereof.

DETAILED DESCRIPTION OF THE PREFERRED EMBODIMENT

As shown in the attached single drawing figure, a binary coded decimal serial bit stream (as will be appreciated hereinafter the invention may employ parallel entry of data just as well) representative of continuously varying data is applied to a shift register 10 under the control of a clock 12. The depicted arrangement presupposes that the clock signal is encoded in the data bit stream itself and may be recovered through any one of various well-known techniques dependent on the modulation scheme (e.g. synchronous differentially coherent phase shift keying demodulation described in U.S. Pat. No. 3,906,376). It will, of course, be realized that any suitable clock 12 (e.g. a separate clock signal generated and transmitted from the data source) may be utilized dependent on the signal format employed.

Once a digital word has been fully entered into shift register 10, its positional bit structure therein would be as shown, with the four bit digital representation for the least significant digit (LSD) occupying the last four stages of the register, the next to least significant digit (NLSD) four bits occupying the immediately preceding four stages thereto, the most significant digit (MSD) four bits occupying the first four stages of the shift register 10 and the next to most significant digit (NMSD) four bits occupying the immediately following four stages thereto. Any additional digits represented in each digital work would of course occupy shift register stages intermediate those for the NLS and NMS digit positions. Since each digital word will of course have a predetermined number of bits dependent on the number of digits to be represented thereby, a recyclable counter 14 having a maximum count equal to the total number of bits in each digital word (including any preamble and synchronization bits not shown) and driven by clock 12 may be employed to generate a momentary enable signal at the termination of each full counting cycle to signify that a digital word has been fully entered into the shift register 10.

Associated with the least significant bit (identified as "1" bit) of each digit represented by a digital word is a storage means, such as a D type flip-flop 16, having its D input connected to the output lead of shift register 10 corresponding to the least significant bit position of the associated digit once the digital word is fully entered. All of the clock (C) inputs of flip-flops 16 are connected to receive the momentary output enable signal of counter 14. in response to which the logic values present on their D input leads are transferred to their respective Q output leads where they are held until the next enable signal. It will be readily appreciated that the least significant bit value for any given digit will of course change only when the digit changes. Thus, assuming that the data represented by the digital words is continuously changing (decreasing or increasing data will work just as well), then the incremental change of one for any particular digit as represented in a newly received digital word will cause the Q output of its associated flip-flop 16 to change logic levels by virtue of the changed value of its least significant bit connected to the D input there of upon the occurrence of the next enable signal. Accordingly, the change in logic level from one state to the other by the Q output of any of the flip-flops 16 is an indication that the associated digit has likewise changed.

Each of the flip-flops 16 has its Q output connected as an input to a bilateral one shot multivibrator 18 associated therewith. Any transition in logic level whether a high (1) to low (0) or low (0) to high (1) at the input of any one of the one shots 18 causes a momentary pulse at its output having any desired period for which the one shots 18 may be designed.

The outputs of one shots 18 are connected through individual resistors 20 in common to the negative input of an operational amplifier 22 whose positive input is grounded (all logic level signals being referenced to ground) and which has a feedback resistor 24 interconnecting its output with its negative input. With resistors 20 all having the same resistance value, it will be readily seen that operational amplifier 22 functions as a summing circuit with or without amplification dependent on the value of resistor 24 with respect to that of resistors 20. Any coincident pulses produced at the outputs of one shots 18 will of course be added together at the output of amplifier 22 while any non-coincidental pulses will be merely individually reflected at its output. Assuming that the pulse amplitudes at the outputs of the one shots 18 are all the same and that amplifier 22 provides no amplification, the smallest amplitude pulse at the outut of amplifier 22 will be equal to the pulse amplitude produced for any single one shot 18 and in particular for the topmost one shot 18 which is associated with the least significant digit of the digital word. This is apparent since the least significant digit (and consequently the least significant bit thereof) is the only digit which can change without any change in any of the other digits. However, every tenth incremental change in the least significant digit will of course be accompanied by an incremental change in the NLS digit, resulting in the coincidence of two pulses at the outputs of their respective one shots 18 upon the occurrence of an enable signal. The composite pulse produced thereby at the output of amplifier 22 will of course then have an amplitude equal to twice that of either individual pulse as represented in the pulse train shown at the output of amplifier 22 in the appended drawing. Similarly, after every ten incremental changes in the NLS digit, an incremental change in the digit following the NLS digit will register an incremental change. Assuming a digital word having four significant digits, that digit would correspond to the NMS digit as depicted in the aforementioned pulse train. Thus, the pulse train of composite pulses at the output of amplifier 22 affords a precise indication of each incremental change in the data monitored while each pulse amplitude thereof indicates the particular digit for which the incremental change occurred. Although the pulse train shown depicts only incremental changes, it is of course realized that it can be calibrated as desired to afford absolute rather than relative values.

By applying the pulse train output of amplifier 22 to a galvanometer recorder 26, a strip chart 28 may be generated for visually displaying the monitored data on a first track thereof. If it were desired to compare this data against another set of data, this could easily be accomplished by using a multi-track galvanometer recorder 26 and applying thereto the other set of data for visual display on a second track thereof.

As the foregoing demonstrates, the invention herein provides a facile technique for precisely monitoring binary coded decimal continuously varying data that lends itself easily to comparison, particularly through visual inspection, with other data. Since changes to the detailed disclosure are no doubt possible without departing from the scope and spirit of the invention, the foregoing is intended to be merely exemplary and not circumscriptive of the invention as it will now be claimed hereinbelow.

What is claimed is:

1. Apparatus responsive to value changes in binary coded decimal digital words representative of continuously varying data, comprising:
   means for receiving each digital word;
   a plurality of storage means connected to the output of said receiving means, there being a different one for each of the digits represented in each digital word, each having means for receiving and storing at its output the value of the least significant bit for its associated digit when enabled;
   means for enabling said storage means upon receipt of a new digital word, and
   a plurality of pulse generators, there being a different one for each of said storage means connected to its output for providing a pulse each time that its associated storage means output changes value irrespective of the direction of change.

2. The apparatus of claim 1 including summing means connected to the outputs of said pulse generators for providing a composite pulse whose amplitude is a function of the sum of all the amplitudes of coincident pulses produced at their outputs.

3. The apparatus of claim 2 including recording means for providing a visual display of the composite pulse output of said summing means.

4. The apparatus of claim 3 wherein said recording means is a galvanometer recorder for providing a strip chart of the pulses at the output of said summing means.

5. The apparatus of claim 1 wherein the digital words comprise a serial bit stream and including a shift register for receiving the bit stream, wherein each of said storage means is connected to the output lead of said register corresponding to the least significant bit position for its associated digit once a digital word is fully loaded into said register.

6. The apparatus of claim 5 including summing means connected to the outputs of said pulse generators for providing a composite pulse whose amplitude is a function of the sum of all the amplitudes of coincident pulses produced at their outputs.

7. The apparatus of claim 6 including recording means for providing a visual display of the pulse output of said summing means.

8. The apparatus of claim 7 wherein said recording means is a galvanometer recorder for providing a strip chart of the pulses at the output of said summing means.

9. A method for providing pulse responses to value changes in binary coded decimal digital words representative of continuously varying data, comprising:
   simultaneously comparing the least significant bit value for each digit represented in each received digital word to the same bit value of the immediately preceding digital word, and
   generating a pulse for each comparison of a bit value that has changed irrespective of the direction of change.

10. The method of claim 9 including summing all pulses generated simultaneously to generate a composite pulse.

11. The method of claim 10 including visually displaying said composite pulse.

12. The method of claim 11 wherein said visual displaying is done via a strip chart.

* * * * *